United States Patent [19]

Gercekci et al.

[11] 4,272,736
[45] Jun. 9, 1981

[54] START STOP OSCILLATOR HAVING FIXED STARTING PHASE

[75] Inventors: Anil Gercekci, Geneva; Heinz B. Maeder, Nyon, both of Switzerland

[73] Assignee: Motorola, Inc., Schaumburg, Ill.

[21] Appl. No.: 47,546

[22] Filed: Jun. 11, 1979

[51] Int. Cl.³ ............................................. H03B 5/12
[52] U.S. Cl. ............................... 331/108 B; 331/135; 331/173
[58] Field of Search ............ 331/117 R, 117 FE, 172, 331/173, 135, 108 B, 108 D

[56] References Cited

U.S. PATENT DOCUMENTS

| | | | |
|---|---|---|---|
| 2,741,701 | 4/1956 | Harris | 331/173 |
| 3,229,227 | 1/1966 | Popodi | 331/117 R |
| 3,725,822 | 4/1973 | Eaton, Jr. | 331/135 X |
| 3,991,388 | 11/1976 | Harshbarger | 331/117 R |
| 4,060,772 | 11/1977 | Yamada et al. | 331/117 FE X |

Primary Examiner—Siegfried H. Grimm
Assistant Examiner—Edward P. Westin
Attorney, Agent, or Firm—Michael D. Bingham

[57] ABSTRACT

An oscillator for generating oscillation signals. The oscillation signals are initiated in response to an applied start signal and begin at a fixed predetermined phase. Hence, the oscillator is suitable for use in phase dependent timing systems to inhibit phase jitter which could otherwise occur. The oscillator includes an inverting amplifier and phase shifting feedback network for establishing and maintaining oscillations. The phase shifting feedback network includes a series coupled coil between the output and input of the inverting amplifier. A bias circuit is included for injecting direct current through the coil when oscillation is inhibited to generate a direct current magnetic field in the coil. The magnetic field ensures that, in response to the start signal, the oscillation signals begin at said fixed phase.

9 Claims, 4 Drawing Figures

START STOP OSCILLATOR HAVING FIXED STARTING PHASE

FIELD OF INVENTION

This invention relates to oscillators and more particularly to Colpitts type oscillators utilizing Metal-Oxide-Silicon Field Effect Transistors (MOSFET).

BACKGROUND OF THE INVENTION

Oscillators with square wave outputs are utilized in many applications. In one such application it may be desired to periodically start and stop the oscillator. For example, the oscillator may be used as the dot generator oscillator for an on screen character generator of a television receiver. In this application it would then be desirable to stop the oscillator during the period that the television receiver's flyback signal is generated and then to start the oscillator upon termination of the flyback signal.

In order to generate a stable set of characters on the screen of the receiver requires a stable operating oscillator. Moreover, the strict timing specification of such a receiver system requires that oscillation start immediately upon termination of the flyback signal. Thus, how such an oscillator is started and when oscillation begins can be of critical importance. Thus, a need exist for an oscillator having good stability and for producing oscillation signals having a fixed starting phase.

SUMMARY OF THE INVENTION

Accordingly, it is an object of the present invention to provide an improved start-stop oscillator having a fixed starting phase.

It is another object of the invention to provide a start stop oscillator suitable for use in an on screen display receiver system.

Still further, another object of the present invention is to provide an oscillator having an useful output signal therefrom occurring within the first cycle after initiation of the oscillation signal.

In accordance with the foregoing and other objects, there is provided a start stop oscillator utilizing MOSFETS which is responsive to start signals for generating oscillation signals having a fixed phase. The oscillator comprises an input latch circuit for providing start and stop control signals, an inverter amplifier section responsive to the start signal for providing the necessary gain to sustain oscillation, a phase shift network coupled between the input and output of the inverter amplifier section for providing a feedback signal to the inverter amplifier section of the required phase shift to cause oscillation and a bias circuit responsive to the stop signals for biasing the oscillator during the period that oscillation is prohibited to ensure that upon initiation in response to the start signal that the oscillation signals start at the same phase.

DETAILED DESCRIPTION OF THE PREFERRED EMBODIMENT

Figure 1:
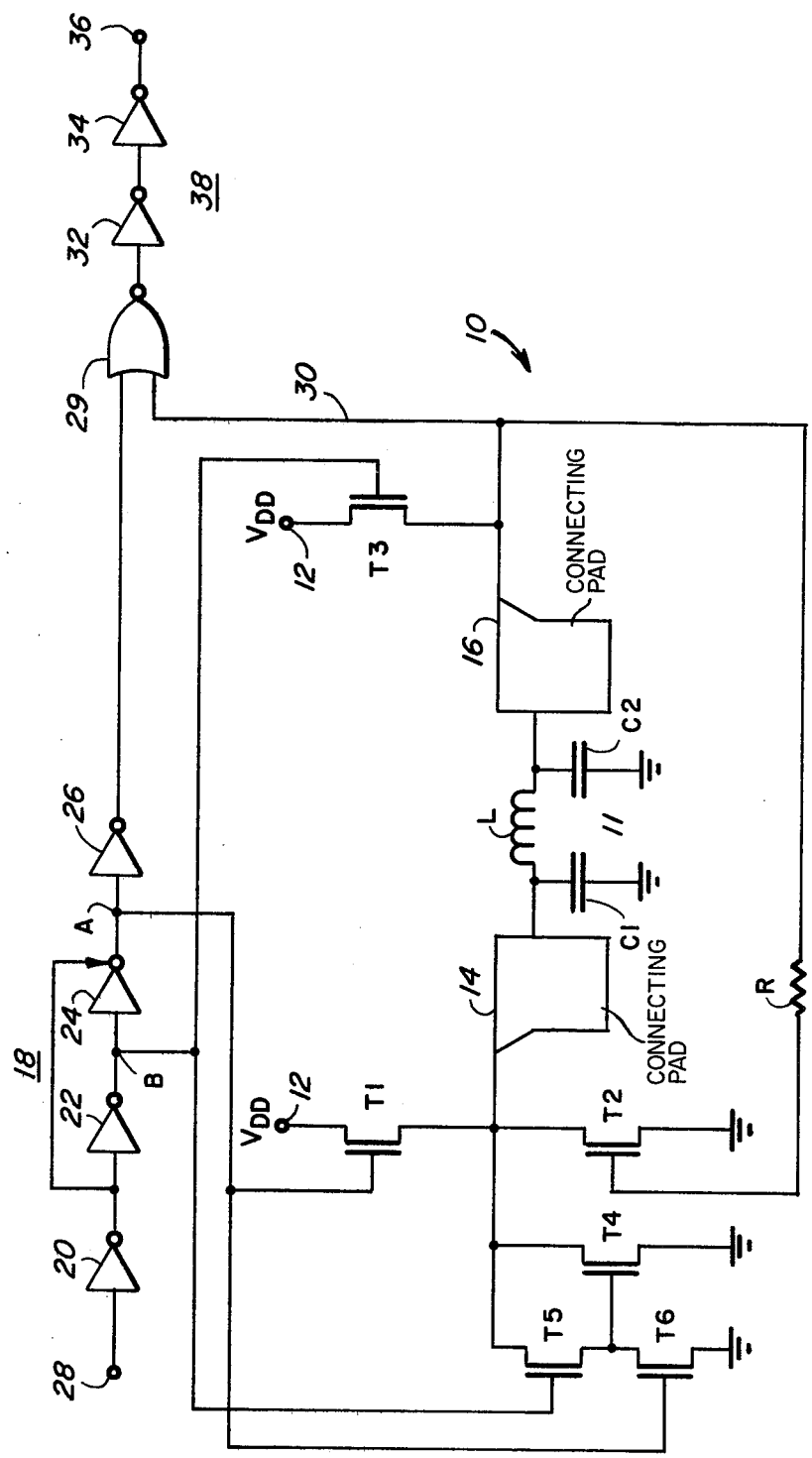
FIG. 1 is a partial schematic block diagram of the start stop oscillator of the present invention.

FIG. 1 illustrates start-stop oscillator 10 of the present invention. Oscillator 10 is a basic Colpitts type oscillator. Oscillator 10 includes an inverter amplifier section comprising transistors T1 and T2 and phase shift network 11 connected between the output of the amplifier section and an input thereof via resistor R. It is to be understood that in the following description all of the transistors comprising oscillator 10 are N channel enhancement MOSFETs. The drain electrode of transistor T1 is adapted to be connected to supply terminal 12 at which is applied an operating potential source $V_{DD}$. The source electrode of transistors T1 is interconnected with the drain electrode of transistor T2 which has its source electrode return to a terminal at which is provided a reference terminal which is shown in the preferred embodiment as being at ground potential. The interconnection point between the source and drain electrodes of respective transistors T1 and T2 is the output of the inverter amplifier and is connected to one terminal of inductor or coil L of phase shift network 11 with the other terminal thereof being coupled to the gate electrode of transistor T2. Phase shifting network 11 also includes capacitors C1 and C2 which shunt the respective terminals of coil L to the ground. It is to be understood that in the preferred embodiment oscillator 10 is suitable to be fabricated in monolithic integrated circuit form with the components comprising phase shifting network 11 being discrete components. Thus, oscillator 10 is shown as having two pads 14 and 16 to which coil L is connected therebetween. The gate electrode of T1 is connected to output node A of logic input control circuit 18. As will be more fully explained hereinafter, a start command signal is produced at node A which activates oscillator 10. Logic input circuit 18 comprises a plurality of inverters 20-26 connected in series configuration. The input to inverter 20 is connected to terminal 28 at which are supplied stop and start signals to oscillator 10. The output of inverter 20 is connected both to the input inverter 22 and to inverter 24. The output of logic input control circuit 18 is taken at the output of inverter 26 the input of which is connected at node A to the output of inverter 24. The input of inverter 24 is connected at node B to the output of inverter 22. Oscillator 10 also includes a biasing circuit arrangement comprising transistors T3, T4, T5 and T6. The oscillation signals appearing at pad 16 are supplied to one input of NOR gate 29 via conductor 30. The other input to NOR gate 29 is connected to the output of inverter 26. The output of NOR gate 29 is coupled to the oscillator output terminal 36 through series connected inverters 32 and 34. Nor gate 29, and inverters 32 and 34 comprise logic output circuit 38.

Although not limited thereto, start stop oscillator 10 of the present embodiment can form the dot oscillator for the on screen character generator of a television receiver circuit. In this application the stop start signal is provided by the flyback pulse of the receiver circuit as shown in FIG. 4A. Hence, whenever the signal is in a high state (wave form portion 40) the oscillator is in a stop mode during which no oscillation signals are generated; this corresponds to the flyback period of the receiver circuit. In response to termination of the flyback pulse (during wave form portion 42) oscillator 10 is activated and produces oscillation signals as shown in FIG. 4B. The oscillations signals of FIG. 4B are indicative of the signals appearing at pad 16 of oscillator 10.

OSCILLATION MODE OF OPERATION

The voltage level at node A will be caused to be at a high level state when the input signal applied at input terminal 28 is low. This causes T1 to become conductive and to serve as an enhancement load to T2. Thus, T1 and T2 form an inverter amplifier to provide 180° of phase shift to the signal applied to the gate of T2 which is then supplied to the output thereof at pad 14. The phase shifting network comprising coil L and capacitors C1 and C2 provide an additional 180° of phase shift to the signal supplied at pad 14. The signal appearing at pad 16 has a phase which is shifted by 360° with respect to the phase of the input signal to the inverter amplifier and is coupled via resistor R to the input of transistor T2 such that oscillation is maintained. T6, which has its gate electrode connected to node A, is rendered conductive such that the gate electrode of T4 is shunted to ground through the drain source path of transistor T6. Hence, transistor T4 is non-conductive during the time that oscillation signals are produced. Concurrently, node B is caused to be at a low voltage level state such that T3 and T5, which have their gate electrodes connected therewith, are biased in a non-conductive state. Moreover, the voltage level at node A, being in a high state, causes the output voltage level of inverter 26 to be in a low state. Thus, NOR gate 29 is triggered between high and low voltage level states in response to the oscillation signals being applied thereto. Therefore, a generally square wave output signal is generated at output terminal 36 having a frequency which is substantially determined by components of the phase shifting network 11.

THE STOP MODE OF OPERATION

In response to the input signal at terminal 28 being in a high voltage level state T1 and T6 are rendered nonconductive because the voltage level at node A is in a low voltage level state and is connected to the respective gate electrodes of these transistors. However, T3 and T5 are rendered conductive since node B is at a high voltage level state. T3 then sources direct current through coil L to T4 and T2. T4 is rendered conductive by having the gate electrode biased through T5. Since both inputs to NOR gate 29 are caused to be in a high voltage level state when a high level input signal is applied to terminal 28, logic output circuit 38 supplies a low level voltage output at terminal 36.

Figure 2:
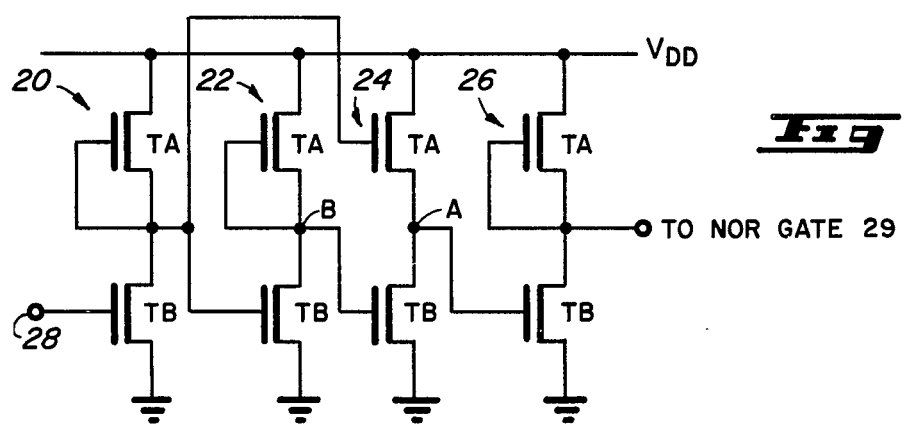
FIG. 2 is a schematic diagram of the input logic control portion of the preferred embodiment of the present invention.

Turning now to FIG. 2 there is shown a schematic diagram of logic input circuit 18 comprising inverters 20, 22, 24 and 26. Each of the respective inverters are formed of two N-channel MOSFETS TA and TB respectively. The drain electrode of transistor TA is connected to the operating potential source $V_{DD}$. The source electrode of transistor TA is connected to the drain electrode of transistor TB with its source electrode returned to ground reference potential. The gate electrode of transistor TA is connected to its source electrode. The gate electrode of the lower transistor TB functions as the input to the inverter with the output thereof being taken at the drain of the same transistor. Each inverter operates in a known manner to provide an output signal of opposite polarity than the polarity of the input signal applied thereto. In the preferred embodiment transistors TA of the inverters are depletion devices which serve as depletion loads to the input device TB. As illustrated in FIG. 2 the output of inverter 20 is applied directly to the input of inverter 22 and to the depletion load device TA of inverter 24. This ensures that node A will quickly rise to a high output level state in response to the start signal being applied at input terminal 28. This reduces the delay between application of the start signal and oscillations to a minimum.

Figure 3:
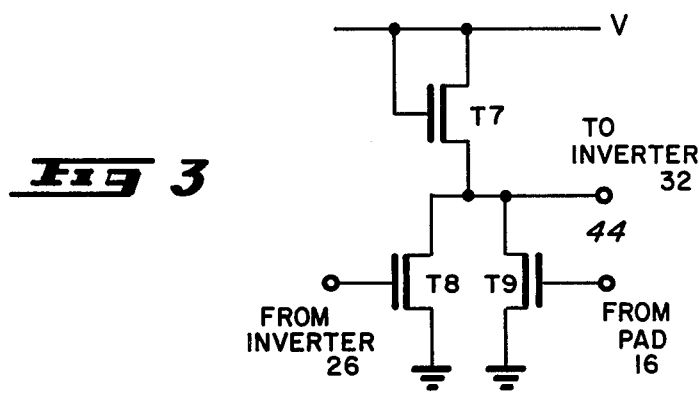
FIG. 3 is a schematic diagram of a portion of the output logic circuitry of the embodiment of the present invention.

NOR gate 29 is shown in FIG. 3 as including 3 N-channel enhancement MOSFETS: T7, T8 and T9. The gate electrodes of T8 and T9 are connected respectively to the output of inverter 26 and to pad 16 of oscillator 10. These two drive devices have their source electrodes connected to ground reference potential and their drain electrodes interconnected to the source electrode of T7. The drain electrode of T7 is connected to operating potential source $V_{DD}$ as is the gate electrode thereof. The operation of NOR gate 29 is well known; with the voltage levels applied to the gate electrodes of T8 and T9 being in a low state the voltage level at output terminal 44 is in a high state. If either of the gate electrodes of T8 and T9 have a voltage applied thereto that is at a high voltage level state, the voltage appearing at output terminal 44 is caused to be at a low voltage level state.

The aforedescribed oscillator circuit has several important features which makes the use of the oscillator in systems having strict timing requirements highly desirable. For example, some systems such as on screen display receivers are sensitive to the starting phase and amplitude of the dot generator used to develop on screen characters. The oscillator of the preferred embodiment can be used in such a system to inhibit phase jitter due to improper starts because oscillations start immediately, with a fixed phase and full amplitude.

Figure 4:
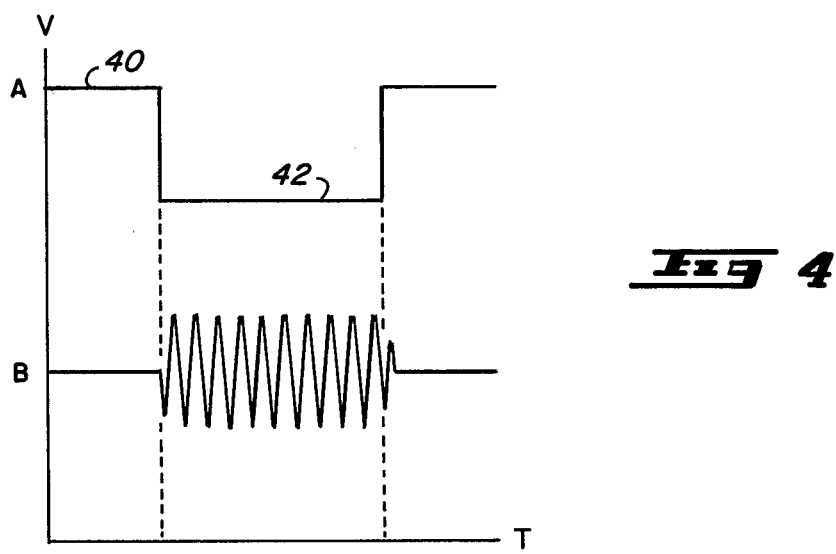
FIG. 4 is a waveform diagram useful for explaining the operation of the present invention.

As illustrated in FIG. 4, when the input signal applied to terminal 28 goes low oscillations begin immediately at a fixed starting phase. The phase at which the oscillations begin is fixed by injecting direct current through coil L during the period that the oscillator is in the stop mode. In the stop mode of operation T3 is rendered conductive by node B being at a high voltage state (the input signal being low) and sources current through T2 and T4. T2 is maintained conductive during the stop mode by having its gate electrodes biased near $V_{DD}$ through T3. T4 is rendered conductive because its gate electrode is biased through T5 to the voltage level appearing at the drain electrode of both T5 and T4 (which are at the same potential as the drain electrode of T2). The direct current through coil L establishes an oriented magnetic field in the coil which causes the oscillations to occur at a predetermined fixed phase.

FIG. 4B illustrates that the oscillation signals are substantially of full amplitude within the first cycle of operation. This feature is important if, for example, the output of the oscillator is used in a count circuit wherein the count must start upon the waveform of FIG. 4A switching to a low state. This is accomplished in the present invention by making the static beta ratio of T3 to T2 and T4 in the stop mode equal to beta ratio of T1 to T2 during the oscillation mode. The beta ratios are made equal by making the width to length ratio of the N-channel region of T3 twice that of T1 and making the physical dimensions of T2 and T4 equal. By making the static and oscillation beta ratios equal, the quiescent bias point (where $V_{IN} = V_{OUT}$) of the amplifier is the same in both the oscillation and stop modes. Thus, all of the transistors comprising oscillator 10 are biased in their linear operating region, i.e., between $V_{DD}$ and $V_{SS}$ and oscillation can start immediately upon release of the stop signal.

It is another important aspect of the invention that the beta ratio of the load transistor T7 to the drive transistors T8 and T9 of NOR gate 29 (FIG. 3) is equal to the oscillation beta ratio (ratio of T1 and T2). This sets the bias point of the NOR gate at its switching threshold so that it switches within the first cycle of oscillation. Thus, a count triggering signal is ensured of being developed at output terminal 36 during the first cycle of operation.

An oscillator has been fabricated with the above described features wherein the following components have the following dimensions:

| COMPONENT | SIZE |
|---|---|
| L | 80nH |
| C$_1$ | 180pF |
| C$_2$ | 80pF |
| DEVICES | CHANNEL WIDTH/LENGTH [MICRONS] |
| T$_1$ | 100/8 |
| T$_2$ | 400/6 |
| T$_3$ | 200/8 |
| T$_4$ | 400/6 |
| T$_5$ | 25/6 |
| T$_6$ | 25/6 |
| NOR 29 | 40/6 (Drive devices) |
|  | 10/8 (Load devices) |

We claim:

1. A start-stop oscillator for generating oscillation signals in response to an applied start signal, the oscillation signals having a predetermined and fixed starting phase associated therewith, comprising:

inverter amplifier means being responsive to the start signal for producing an output signal at an output having a predetermined amplitude and phase, the phase of said output signal being shifted a predetermined amount with respect to the phase of an input signal which is applied to the input of said inverter amplifier;

phase shifting means for shifting the phase of said output signal from said inverter amplifier by a predetermined amount, said phase shifting means being connected between said output and input of said inverter amplifier means and including inductive circuit means, and bias circuit means coupled both to said inverter amplifier means and said inductive circuit means and being responsive to a stop signal applied to the oscillator for inhibiting the oscillation signals and for producing a direct current that is injected through said inductive circuit means thereby establishing the beginning phase of the oscillation signals at the initiation thereof.

2. An oscillator for generating oscillation signals in response to an applied start signal, the oscillation signals having a fixed starting phase associated therewith, comprising:

inverter amplifier means being responsive to the start signal for producing an output signal at an output having substantially full oscillation amplitude and a predetermined phase, the phase of said output signal being shifted a predetermined amount with respect to the phase of an input signal which is applied to the input of said inverter amplifier;

phase shifting means for shifting the phase of said output signal from said inverter amplifier by a predetermined amount, said phase shifting means being connected between said output and input of said inverter amplifier means and including inductive circuit means;

bias circuit means coupled both to said inverter circuit means and to said inductive circuit means and being responsive to a stop signal applied to the oscillator for inhibiting the oscillation signals and for producing a direct current that is injected through said inductive circuit means thereby establishing the beginning phase of the oscillation signals at the initiation thereof; and input logic control circuit means having an input at which the start and stop signals are applied and a plurality of outputs, a first output being coupled to said inverter amplifier means and a second output being coupled to said bias circuit means, said input logic control circuit producing a start command signal at said first output in response to the start signal and producing a stop command signal at said second output in response to the stop signal.

3. The oscillator of claim 2 wherein said inverter amplifier means includes:

a first field effect transistor having first, second and control electrodes, said control electrode being coupled to said first output of said input logic control circuit means, said second electrode being connected to a terminal at which is supplied a source of operating potential; and a second field effect transistor having first, second, and control electrodes, said control electrode being said input of said inverter amplifier means, said first electrode being connected to a terminal at which is supplied a ground reference potential, said second electrode being interconnected with said first electrode of said first field effect transistor to said output of said inverter amplifier means.

4. The oscillator of claim 3 wherein said bias circuit means includes a first field effect transistor having first, second and control electrodes, said control electrode being connected to said second output of said input logic control circuit means, said first electrode being connected to said inductive circuit means of said phase shifting means, said second electrode being connected to said terminal at which is supplied a source of operating potential.

5. The oscillator of claim 4 wherein said bias circuit means further includes:

a second field effect transistor having first, second and control electrodes, said first electrode being connected to said terminal at which is supplied a ground reference potential, said second electrode being connected to said output of said inverter amplifier means;

a third field effect transistor having first, second, and control electrodes, said first electrode being connected to said control electrode of said second field effect transistor of said bias circuit means, said second electrode being connected to said second electrode of said second field effect transistor of said bias circuit means, said control electrode being connected to said second output of said input logic control circuit means; and a fourth field effect transistor having first, second and control electrodes, said first electrode being connected to said terminal at which a ground reference potential is supplied, said second electrode being connected to said first electrode of said third field effect transistor of said bias circuit means, and said control electrode being connected to said first output of said input logic control circuit means.

6. The oscillator of claim 5 wherein said phase shifting means comprises:

said inductive circuit means being a coil having first and second terminals, said first terminal being connected to said output of said inverter amplifier means said second terminal being coupled both to said input of said inverter amplifier means and to said first electrode of said first field effect transistor of said bias circuit means;

first capacitive circuit means coupled between said first terminal of said coil and said terminal at which a ground reference potential is supplied; and second capacitive circuit means coupled between said second terminal of said coil and said terminal at which a ground reference potential is supplied.

7. The oscillator of claim 5 including a output logic control circuit means having first and second inputs and an output for producing substantially square wave oscillations signals at said output, said first input being coupled to an additional output of said input logic control circuit means such that a bias signal is supplied thereto in response to the start signal, said second input being connected to said first electrode of said first field effect transistor of said bias circuit means, said second input receiving oscillation signals from said phase shifting means.

8. The oscillator of claim 7 wherein said output logic control circuit means includes:

a NOR logic gate having first, second inputs and an output, said first and second inputs being said first and second inputs of said output logic control circuit respectively;

a first inverter amplifier having an input and output, said input being connected to said output of said NOR logic gate; and a second inverter amplifier having an input and output, said input being connected to said output of said first inverter amplifier, said output being said output of said output logic control circuit means.

9. The oscillator of claim 7 wherein said input logic control circuit includes:

a first inverter amplifier having an input and output, said input being the input of said input logic control circuit means;

a second inverter amplifier having an input and output, said input being connected to said output of said first inverter amplifier of said input logic control circuit means, said output being said second output of said input logic control circuit means;

a third inverter amplifier having first and second inputs and an output, said first input being connected to said output of said second inverter amplifier of said input logic control circuit means, said second input being connected to said output of said first inverter amplifier of said input logic control circuit means, said output being said first output of said input logic control circuit; and a fourth inverter amplifier having an input and an output, said input being connected to said third inverter amplifier, said output being said additional output of logic control circuit means.

* * * * *